US006180977B1

United States Patent
Lin et al.

(10) Patent No.: US 6,180,977 B1
(45) Date of Patent: Jan. 30, 2001

(54) SELF-ALIGNED EDGE IMPLANTED CELL TO REDUCE LEAKAGE CURRENT AND IMPROVE PROGRAM SPEED IN SPLIT-GATE FLASH

(75) Inventors: Yai-Fen Lin, Taichung; Hung-Cheng Sung, Hsin-Chu; Chia-Ta Hsieh, Tainan; Di-Son Kuo, Hsinchu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/389,631

(22) Filed: Sep. 3, 1999

Related U.S. Application Data

(62) Division of application No. 08/984,842, filed on Dec. 4, 1997, now Pat. No. 5,972,753.

(51) Int. Cl.⁷ ................................................ H01L 29/76
(52) U.S. Cl. ........................ 257/314; 257/261; 257/314; 257/315; 257/316; 257/318
(58) Field of Search .................................. 257/314, 315, 257/316, 318, 261

(56) References Cited

U.S. PATENT DOCUMENTS

| | | | |
|---|---|---|---|
| 5,422,301 | 6/1995 | Otsuki | 437/70 |
| 5,500,379 | 3/1996 | Odake et al. | 437/34 |
| 5,516,711 | 5/1996 | Wang | 437/34 |
| 5,606,521 * | 2/1997 | Kuo et al. | 365/149 |
| 5,607,868 | 3/1997 | Chida et al. | 437/34 |
| 5,619,052 * | 4/1997 | Chang et al. | 257/321 |
| 5,631,482 * | 5/1997 | Hong | 257/326 |
| 5,760,435 * | 6/1998 | Pan | 257/314 |
| 5,929,479 * | 7/1999 | Oyama | 257/315 |
| 5,936,274 * | 8/1999 | Forbes et al. | 257/315 |
| 5,981,993 * | 11/1999 | Cho | 257/311 |
| 6,038,171 * | 3/2000 | McElheny | 365/185.14 |

FOREIGN PATENT DOCUMENTS

| | | | |
|---|---|---|---|
| 405121755 * | 5/1993 | (JP) | 257/314 |
| 405259466 * | 5/1993 | (JP) | 257/314 |
| 405136428 * | 6/1993 | (JP) | 257/314 |
| 405259469 * | 10/1993 | (JP) | 257/314 |

OTHER PUBLICATIONS

S. Wolf, "Silicon Processing For The VLSI Era" vol. 2, Lattice Press, Sunset Beach CA, 1990, p 632–634.

* cited by examiner

*Primary Examiner*—Mahshid Saadat
*Assistant Examiner*—Edgardo Ortiz
(74) *Attorney, Agent, or Firm*—George O. Saile; Stephen B. Ackerman

(57) ABSTRACT

A method is provided for fabricating a self-aligned edge implanted split-gate flash memory comprising a semiconductor substrate of a first conductivity type having separated first and second regions of a second conductivity type formed therein, the first and second regions defining a substrate channel region therebetween; a floating gate separated from a doped region in the substrate by an oxide layer; a control gate partially overlying and separated by an insulator from said floating gate; said floating gate having thin portions and thick portions; and said thin portions of said floating gate overlying twice doped regions in said semiconductor substrate to reduce surface leakage current and improve program speed of the memory cell.

4 Claims, 4 Drawing Sheets

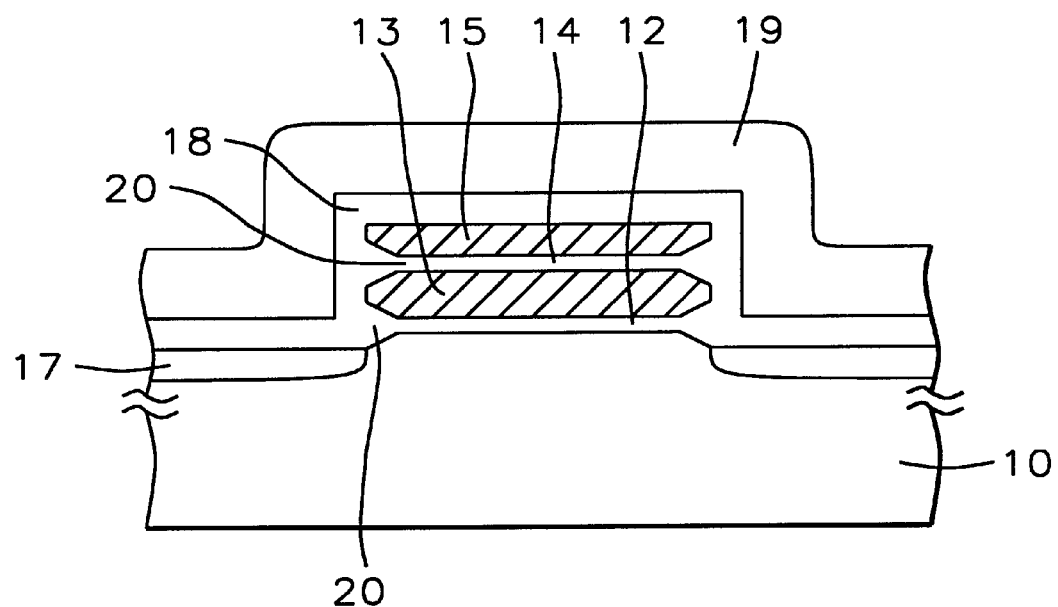
*FIG. 1 – Prior Art*
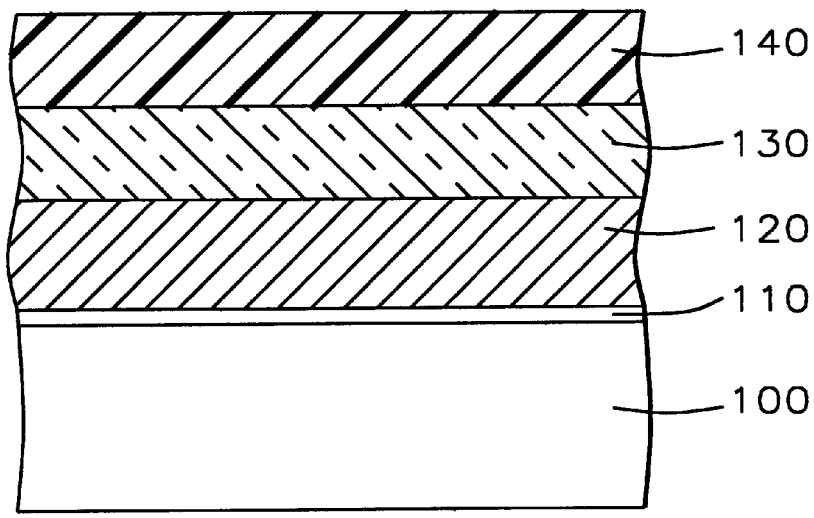
*FIG. 2a*

SELF-ALIGNED EDGE IMPLANTED CELL TO REDUCE LEAKAGE CURRENT AND IMPROVE PROGRAM SPEED IN SPLIT-GATE FLASH

This is a division of Patent application Ser. No. 08/984,842, filing date Dec. 4, 1997 now U.S. Pat. No. 5,972,753, A Method Of Self-Align Cell Edge Implant To Reduce Leakage Current Andimprove Program Speed In Split-Gate Flash, assigned to the same assignee as the present invention.

BACKGROUND OF THE INVENTION

(1) Field of the Invention

The present invention relates to split-gate memory cells used in flash EEPROMs (Electrically Erasable Programmable Read Only Memories), and in particular, to a split-gate memory cell having a self-aligned edge implant to reduce leakage current and improved speed.

(2) Description of the Related Art

Among the nonvolatile read only memories, such as masked-ROMs, Electrically Programmable (EP-ROMs), EEPROMs have been known as one type of nonvolatile memory semiconductor devices capable of electrically writing and erasing information. However, EEPROMs require two transistors to operate. In Flash EEPROM, the memory cell includes one transistor, and the contents of all the memory's cells can be erased simultaneously through the use of an electrical erase signal. Hence, with Flash memory, in addition to gaining speed in having the cells erased much more rapidly, higher levels of integration can be achieved with fewer devices.

The unit cell of an EEPROM memory device is usually comprised of a silicon substrate provided with a source and a drain, and two polysilicon gates; that is, a MOS transistor having a channel defined by the source and drain regions, a floating gate to which there is no direct electrical connection and a control gate with a direct electrical connection. The floating gate is separated from the substrate by an insulating layer of, for example, silicon oxide. The control gate is generally positioned over the floating gate with a layer of insulating material separating the two gates. To program a transistor, charge is transferred from the substrate through the insulator and is stored on the floating gate of the transistor. The amount of charge is set to one of two levels to indicate whether the cell has been programmed "on" of "off." "Reading" of the cell's state is accomplished by applying appropriate voltages to the cell source and drain, and to the control gate, and then sensing the amount of charge on the floating gate. To erase the contents of a cell, the programming process is reversed, namely, charges are removed from the floating gate by transferring them back to the substrate through the insulator. A fairly recent technology is "flash" memories in which the entire array of memory cells, or a significant subset thereof, is erased simultaneously. Flash EEPROMs combine the advantages of UV-erasable EPROMS and floating-gate EEPROMs. They offer high density, small cell size, the well-known hot-electron writability of EPROMs, together with the easy erasability, on-board reprogrammability, and electron-tunneling erasure feature of EEPROMs (See S. Wolf, "Silicon Processing for the VLSI Era," vol. 2, Lattice Press, Sunset Beach, Calif., 1990, pp. 632–634.)

Programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of critical importance in the tunneling region is the quality and the thinness of the tunneling oxide separating the floating gate from the substrate. Usually a thickness of between about 80 to 120 Angstroms is required to facilitate Fowler-Nordheim tunneling.

A cross section of a conventional Flash EEPROM is shown in FIG. 1. Drain impurity diffusion layer (16) and a source impurity diffusion layer (17) are formed on a main surface of the semiconductor substrate (10) and are spaced from each other by a predetermined distance with a channel region therebetween. The conventional Flash EEPROM further includes a floating gate electrode (13) formed on the channel region with a first gate oxide film (12) therebetween, a control gate electrode (15) formed on the floating gate electrode (13) with an insulating film (14) therebetween, an interlayer thermal oxide film (18) covering the semiconductor substrate (10), floating gate electrode (13) and control gate electrode (15), and an interlayer insulating film (19) covering the interlayer thermal oxide film (18). Gate bird's beak oxide films (20) are formed at opposite ends of the first gate oxide film (12) and opposite end of the insulating film (14). The interlayer insulating film (19) contains impurity such as boron or phosphorous. The purpose of the interlayer thermal oxide film (18) is to prevent the movement of impurity such as boron of phosphorous of the interlayer insulating film (19) into the semiconductor substrate (10), control gate electrode (15) or floating gate electrode (13) and thus to prevent change of the electrical characteristics thereof.

After the final step of forming the interlayer insulating film (19) to cover the interlayer thermal oxide film (18) shown in FIG. 1, usually heat treatment by a reflow method is carried out to flatten the interlayer insulating film (19). During this process as well as during thermally growing the thermal oxide layer (18) by means of wet oxidation, oxidizer (H$_2$O) penetrates the interlayer insulating film (19) and interlayer thermal oxide film (18). This causes further oxidization between the semiconductor substrate (10) and the ends of the floating gate electrode (13), and between the control gate electrode (15) and the floating gate electrode (13). As a result, the gate bird's beak oxide films (20) are formed. Consequently, the lower end of the floating gate electrode (13) contacts the gate bird's beak oxide films (20) so that the lower end of the floating gate electrode (13) is oxidized to a large extent as compared with the other portions. If the gate bird's beak oxide film (20) are formed at the lower end of the floating gate (13) and the source impurity diffusion layer (17), the electron is excessively drawn from the floating gate electrode (13) in the data erasing operation, resulting in an over-erased state. If the gate bird's beak oxide films (20) are formed at the end of the floating gate electrode (13) near the drain impurity diffusion layer (16), a so-called drain disturb phenomenon occurs, in which the electrons are drawn from the floating gate electrode (13) of the unselected memory cell in the data writing operation.

An explanation for the occurrence of the drain disturb phenomenon and the over-erase phenomenon is usually given as follows: The floating gate electrode (13) is formed of polycrystalline silicon layer. Since the polycrystalline silicon is liable to be oxidized along the grain boundary of the crystal, the shape of the crystal changes from round shape to sharp shape as oxidation process. When the crystal has sharper concentration, electric field tends to occur at the protruding portion. More specifically, at the lower end portions of the floating gate electrode (13) of the prior art, concentration of electric field tends to occur as the gate bird's beak oxide films (20) are formed. Such concentration of electric fields leads to over-erased phenomenon and the drain disturb phenomenon, which in turn cause current leakage and reduction in speed of the device.

Related art teaches methods of forming split-gate memories with different techniques. U.S. Pat. No. 5,516,711 by Wang shows a method of forming lightly doped drains (LDD) with oblique ion implantation. In U.S. Pat. No. 5,500,379, Odake uses a low dose of phosphorous impurity after the formation of gate electrodes. Chida shows in U.S. Pat. No. 5,607,868, a method of forming a channel ion implantation through a conductive gate layer. Otsuki, on the other hand, shows in U.S. Pat. No. 5,422,301 a method of forming a threshold ion implantation under the gates. However, this invention teaches a self-aligned ion implantation through the thinner oxide and poly in the cell edge to form boron doped regions in the substrate.

SUMMARY OF THE INVENTION

It is therefore an object of this invention to provide a split-gate memory cell having a self-aligned edge implant to reduce leakage current and to improve speed of the same.

It is another object of this invention to provide a method of reducing leakage current in a split-gate memory cell.

It is yet another object of this invention to provide a method of increasing the speed of a split-gate memory cell.

These objects are accomplished by providing a method for forming a tunnel oxide layer over a semiconductor substrate; forming a first polysilicon layer over said tunnel oxide layer; forming a nitride layer over said first polysilicon layer; forming a photoresist layer over said first polysilicon layer; patterning said photoresist layer, said nitride layer to define a floating gate in said first polysilicon layer; performing a first implant of impurity in the memory cell; removing said photoresist layer; oxidizing said first polysilicon layer; performing a second implant of impurity using the edge of the floating gate for self-alignment with the cell; forming impurity concentration at the cell edge to reduce surface leakage current; removing said nitride layer; etching said first polysilicon layer; forming an oxide layer over said first polysilicon layer; forming a second polysilicon layer over said oxide layer; and patterning said second polysilicon layer to form a control gate.

These objects are further accomplished by providing a semiconductor substrate of a first conductivity type having separated first and second regions of a second conductivity type formed therein, the first and second regions defining a substrate channel region therebetween; a floating gate separated from a doped region in the substrate by an oxide layer; a control gate partially overylying and separated by an oval shaped poly-oxide layer from said floating gate; said oval shaped poly-oxide layer having thin portions towards the edge of said oval shaped poly-oxide layer and thick portions towards the center of said oval shaped poly-oxide layer; and edge portions of said floating gate underlying said thin portions overlying twice doped regions in said semiconductor substrate.

BRIEF DESCRIPTION OF THE DRAWINGS

In the accompanying drawings, similar numerals refer to similar parts throughout the several views.

FIG. 1 is a partial cross-sectional view of a Flash EEPROM of prior art.

FIG. 2a is a partial cross-sectional view of a semiconductor substrate showing the deposition of tunnel oxide, polycrystalline silicon and nitride layers according to this invention.

DESCRIPTION OF THE PREFERRED EMBODIMENTS

Figure 2B:
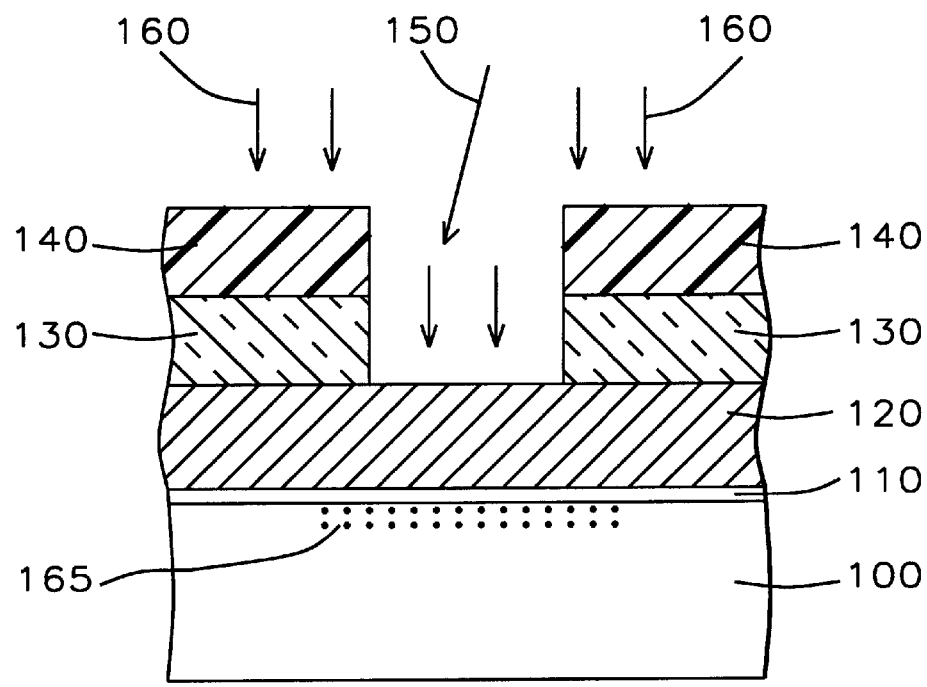
FIG. 2b is a partial cross-sectional view of the substrate of FIG. 2a showing the definition of a floating gate according to this invention.

Referring now to the drawings, in particular to FIGS. 2a–2g, there are shown schematically steps of forming a self-aligned edge implanted split-gate flash memory to reduce surface leakage current and improve speed of the memory cell.

In FIG. 2a, substrate (100), preferably silicon of a first conductivity type, is provided with separated first and second regions of a second conductivity type formed therein, the first and second regions defining a substrate channel region therebetween. The first and second regions of a second conductivity type, namely, the source and drain regions, are shown schematically only in FIG. 2g as references (197) and (199), respectively, so as to not unnecessarily obscure the main steps in FIGS. 2a–2f. Thus, in FIGS. 2a–2f, a partial section of substrate (100) is shown where the disclosed invention can best be understood.

In the embodiment of this invention, it is preferred that tunnel oxide (110) of a thickness between about 70 to 90 angstroms (Å) is deposited over substrate (100). This is followed by deposition of a first polycrystalline silicon (polysilicon) layer (120) with a thickness between about 1000 to 1200 Å. Next, silicon nitride (130) is deposited to a thickness between about 700 to 800 Å.

At the following steps to define a floating gate, a photoresist layer (140) is first spun on the substrate and then patterned, and nitride layer (130) is etched using recipe gases comprising $SF_6$ and $O_2$. Using the patterned photoresist and nitride layers as a mask (150), a first implantation of boron (160) into the semiconductor substrate (100) is performed with a concentration between about $1\times10^{12}$ to $5\times10^{12}$ atoms/cm² at an energy level between about 70 to 80 KEV. The boron ions are then diffused into region (165) shown in FIG. 2b.

Figure 2C:
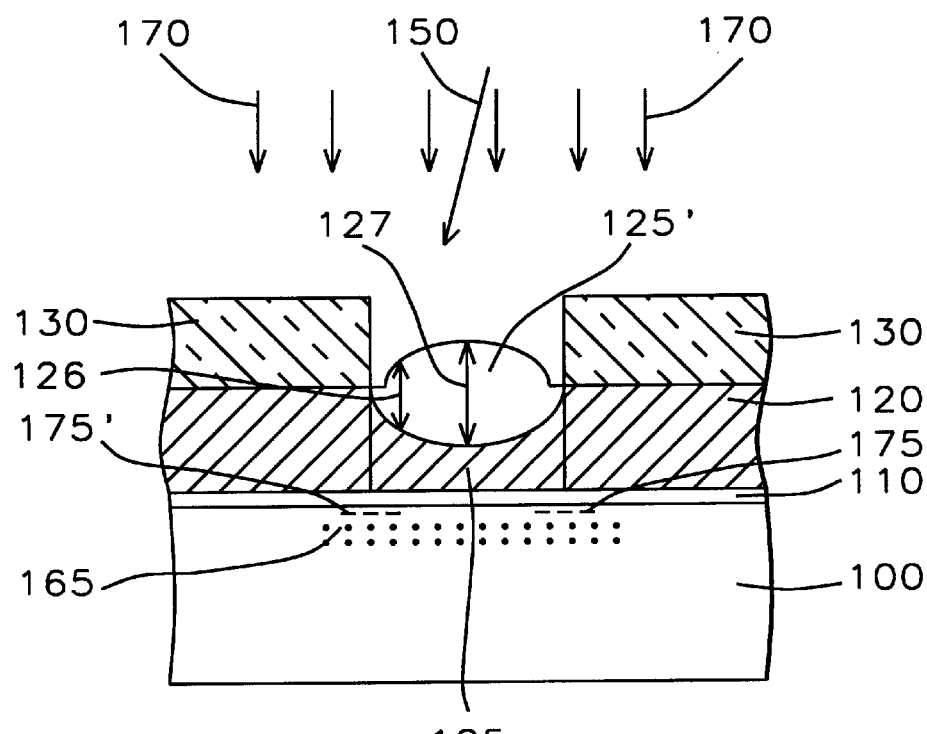
FIG. 2c is a partial cross-sectional view of the substrate of FIG. 2b showing self-align edge implant according to this invention.

Thereafter, photoresist layer (140) is removed, and as an important step, first polysilicon layer is oxidized through thermal growth in a furnace at temperature between about 850 to 900° C. This oxidation process causes polyoxide (125') to grow into opening (150) as shown in FIG. 2c. It is important to note here that the growth of the polyoxide is nonuniform in hole (150) and that its somewhat oval shape has thin portions (126) near the edges of the hole and thick portions (127) near the center of the hole. Therefore in the next key step of second ion implantation (170), a higher concentration of ions diffuses into the substrate along the edge of the hole, because they travel through the thinner portion of the polyoxide. Only a few, if any, arrive in the substrate as they travel through the thicker portion of the polyoxide. It is important that the oxidation be carried so that portion (127) has a thickness between about 1400 to 1700 Å.

It is preferred that the second self-aligned edge implant is performed with boron again but under conditions of a concentration between about $1\times10^{12}$ to $5\times10^{12}$ atoms/cm² and at an energy level between about 70 to 80 KEV. The presence of additional boron ions near the edges shown in FIG. 2c modifies the programming behavior of current flow from drain (199) through (175') (see FIG. 2g) to the floating gate (125) which is now formed under the polyoxide (125'). In other words, surface leakage current is prevented. This will be clearer later after the formation of the control gate (190) shown in FIG. 2f.

Figure 2D:
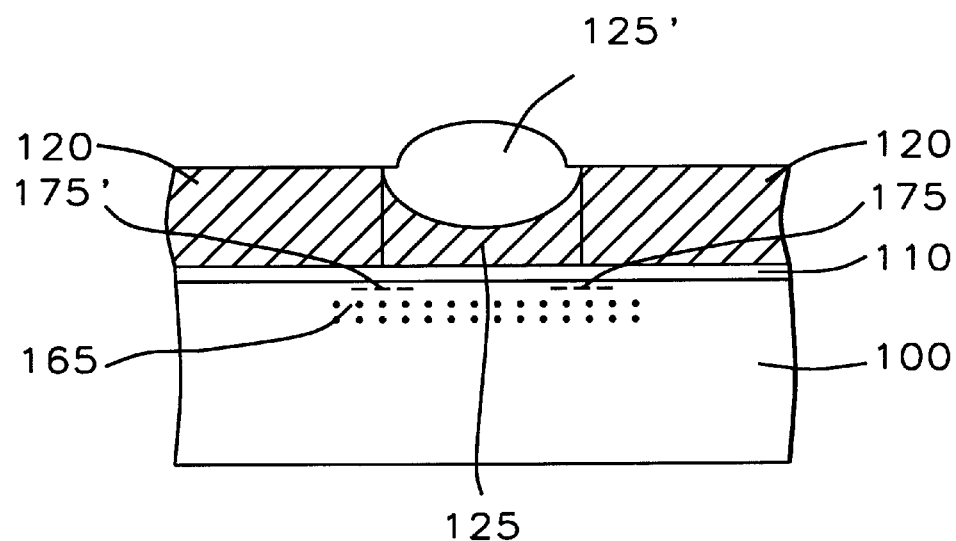
FIG. 2d is a partial cross-sectional view of the substrate of FIG. 2c showing the removal of the nitride layer according to this invention.
Figure 2E:
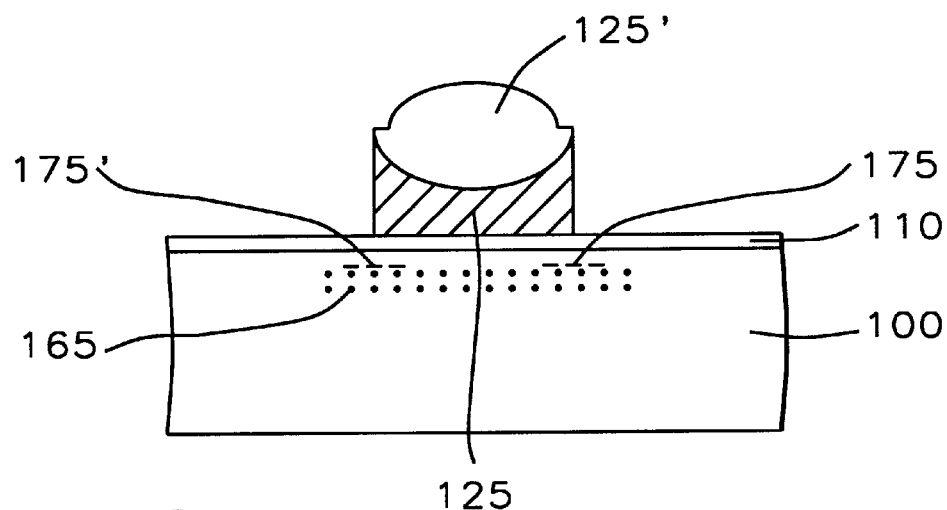
FIG. 2e is a partial cross-sectional view of the substrate of FIG. 2d showing the polysilicon etch according to this invention.
Figure 2F:
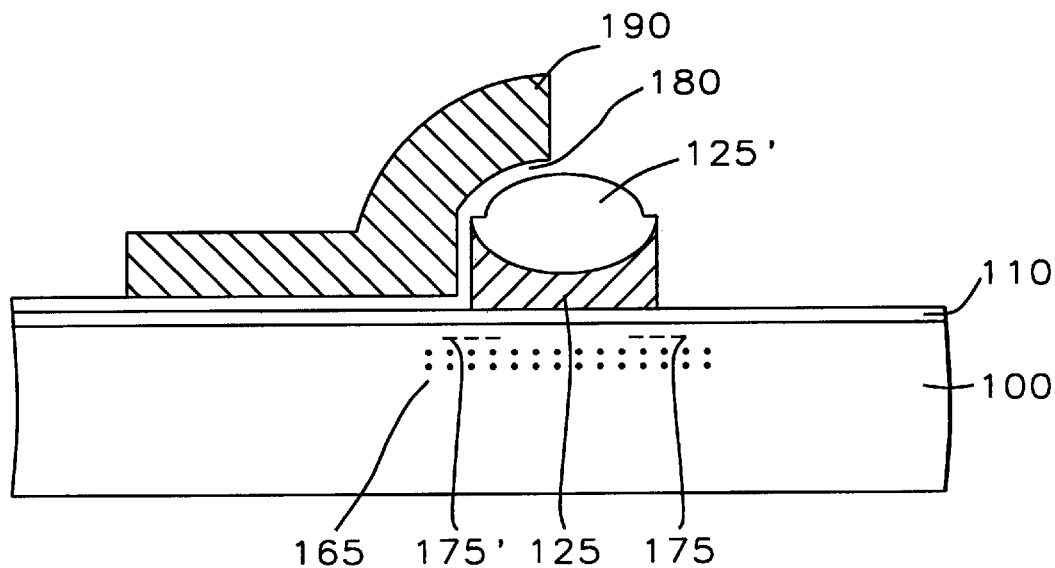
FIG. 2f is a partial cross-sectional view of the substrate of FIG. 2e showing the forming of a control gate according to this invention.

At the next steps, nitride layer (130) is removed, and first polysilicon layer (120) is etched using the oval shaped poly-oxide (125') as a hard mask, thus forming floating gate (125) as shown in FIGS. 2d–2e. It is preferred that the etching recipe comprises gases HBr, $Cl_2$, He and $O_2$. Inter-poly oxide (180) and second polysilicon layer (190) are subsequently formed and patterned as shown in FIG. 2f, where the preferred thicknesses are, respectively, between about 200 to 300 Å, and 2000 to 2500 Å.

Figure 2G:
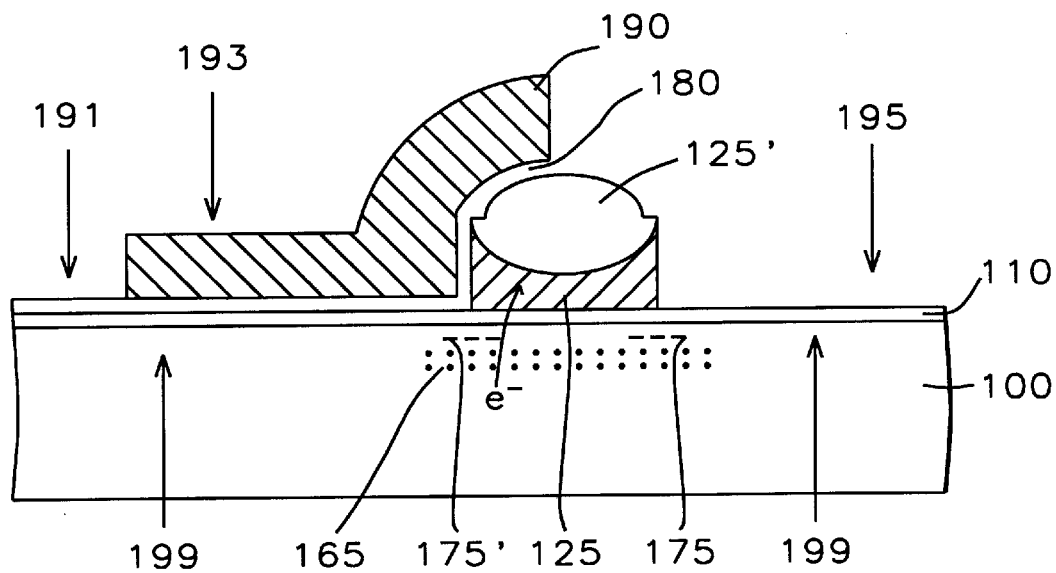
FIG. 2g is a partial cross-sectional view of the substrate of FIG. 2f showing the programming of a split-gate Flash memory according to this invention.

The resulting structure of FIG. 2g, with locally boron rich channel 175', tunnel oxide (110), floating gate (125), poly-oxide layer (125'), interpoly oxide layer (180) control gate (190), source (197) and drain (199) completes the self-aligned edge implanted split-gate flash memory of this invention.

In operation, to program by source-side coupling voltage (197) channel hot electron injection, for example, the drain side (199) is applied 1 volt and the control gate (190) is applied 2 volts. A voltage of about 8.5 volts (195) is applied to source side (197) resulting in a high voltage drop of between about 7 to 7.5 volts between region (165) and control gate (190). This is because, region (175') produces a high electric field thereby injecting electrons to floating gate (125) through electron flow from drain to source (197). The boron dose in the cell edge will then reduce surface leakage current and increase electric field to improve program speed.

While the invention has been particularly shown and described with reference to the preferred embodiments thereof, it will be understood by those skilled in the art that various changes in form and details may be made without departing from the spirit and scope of the invention.

What is claimed is:

1. A self-aligned edge implanted split-gate flash memory comprising:

a semiconductor substrate of a first conductivity type having separated first and second regions of a second conductivity type formed therein, the first and second regions defining a substrate channel region therebetween;

a floating gate separated from a doped region in the substrate by an oxide layer;

a control gate partially overlying and separated by an oval shaped poly-oxide layer from said floating gate;

said oval shaped poly-oxide layer having thin portions, including flat upper surface towards the edge of said oval shaped poly-oxide layer and thick portions towards the center of said oval shaped poly-oxide layer; and edge portions of said floating gate underlying said thin portions overlying twice doped regions in said semiconductor substrate.

2. The self-aligned edge implanted split-gate flash memory of claim 1, wherein said floating gate and control gate comprise polycrystalline silicon.

3. The self-aligned edge implanted split-gate flash memory of claim 1, wherein said thin and thick portions comprise oxidized polysilicon.

4. The self-aligned edge implanted split-gate flash memory of claim 1, wherein said twice doped regions in said semiconductor substrate are aligned with edge of said floating gate.

\* \* \* \* \*